US 8,256,948 B2

(12) United States Patent
Matsushita

(10) Patent No.: US 8,256,948 B2
(45) Date of Patent: Sep. 4, 2012

(54) LIGHT EMITTING DIODE DISPLAY DEVICE AND PORTABLE TERMINAL DEVICE

(75) Inventor: Akimasa Matsushita, Saitama (JP)

(73) Assignee: NEC Corporation, Tokyo (JP)

( * ) Notice: Subject to any disclaimer, the term of this patent is extended or adjusted under 35 U.S.C. 154(b) by 288 days.

(21) Appl. No.: 12/514,646

(22) PCT Filed: Oct. 29, 2007

(86) PCT No.: PCT/JP2007/071031
§ 371 (c)(1),
(2), (4) Date: May 13, 2009

(87) PCT Pub. No.: WO2008/059708
PCT Pub. Date: May 22, 2008

(65) Prior Publication Data
US 2010/0141176 A1    Jun. 10, 2010

(30) Foreign Application Priority Data
Nov. 14, 2006   (JP) ................................. 2006-307862

(51) Int. Cl.
*F21V 7/04* (2006.01)
(52) U.S. Cl. ........ 362/612; 362/600; 362/615; 362/555; 362/611; 362/613; 315/291
(58) Field of Classification Search .................. 362/619, 362/555; 315/294
See application file for complete search history.

(56) References Cited

U.S. PATENT DOCUMENTS

| 4,929,866 | A | 5/1990 | Murata et al. |
| 5,857,273 | A | 1/1999 | Rapisarda |
| 5,899,552 | A * | 5/1999 | Yokoyama et al. ........... 362/619 |
| 6,288,700 | B1 | 9/2001 | Mori |
| 2003/0063456 | A1 | 4/2003 | Katahira |
| 2004/0174717 | A1* | 9/2004 | Adachi et al. ................. 362/555 |

(Continued)

FOREIGN PATENT DOCUMENTS

DE      199 62 040 A1   7/2001

(Continued)

OTHER PUBLICATIONS

Supplementary European Search Report for EP 07 83 0765 completed Mar. 17, 2010.

(Continued)

*Primary Examiner* — Douglas W Owens
*Assistant Examiner* — Jonathan Cooper
(74) *Attorney, Agent, or Firm* — Michael Dryja

(57) ABSTRACT

An LED 1 and an LED 2 are respectively arranged at diagonal positions so as to face the long sides of a lens 3 having a shape of a substantially rectangular parallelepiped. Further, the LED 1 and the LED 2 respectively emit light beams to the side surface portions of the long sides of the lens 3 so as to prevent the light beams from intersecting with each other. The lens 3 has a function to reflect the light beams emitted by the LED 1 and the LED 2 by cut-out sections 34 to 36 and projecting sections 31 to 33. Therefore, the light beams emitted by the LED 1 and the LED 2 are emitted from holes of a display section side case 10, which holes are formed in correspondence with the three light-emitting sections 31 to 33 of the lens 3.

9 Claims, 7 Drawing Sheets

U.S. PATENT DOCUMENTS

2005/0254771 A1* 11/2005 Yamashita et al. ............ 385/146
2006/0220909 A1* 10/2006 Lin ................................ 340/907

FOREIGN PATENT DOCUMENTS

| DE | 20 2005 020295 U1 | 5/2006 |
|---|---|---|
| JP | 1995301714 A | 11/1995 |
| JP | 1998021722 A | 1/1998 |
| JP | 2000214825 A | 8/2000 |
| JP | 2000322013 A | 11/2000 |
| JP | 2004061693 A | 2/2004 |
| JP | 2004079488 A | 3/2004 |
| JP | 2005209618 A | 8/2005 |
| WO | 2008003814 A1 | 1/2008 |

OTHER PUBLICATIONS

International Search Report for PCT/JP2007/071031 mailed Nov. 27, 2007.

Japanese Patent Office office action in counterpart JP patent application 2006-307862, dated Jun. 14, 2012 (citing above-referenced JP patent application).

* cited by examiner

F I G. 14
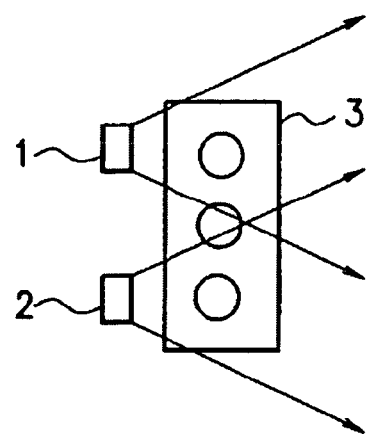
F I G. 15
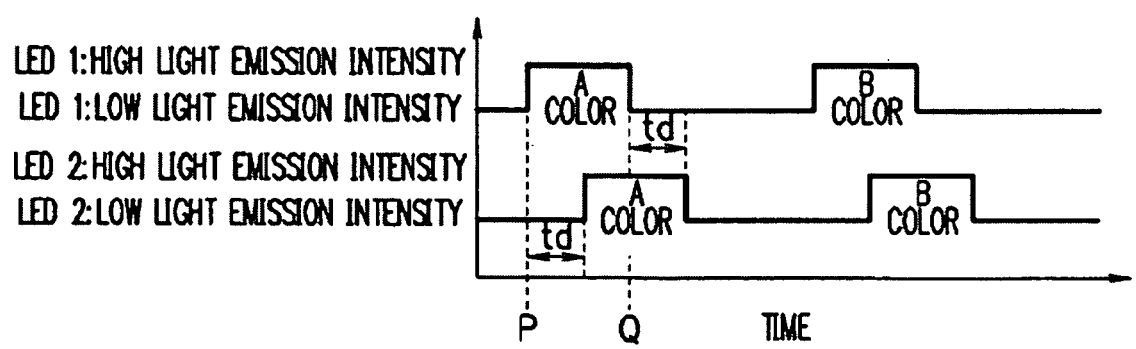

US 8,256,948 B2

LIGHT EMITTING DIODE DISPLAY DEVICE AND PORTABLE TERMINAL DEVICE

This application is the National Phase of PCT/JP2007/071031, filed Oct. 29, 2007, which is based upon and claims the benefit of priority from Japanese patent application No. 2006-307862, filed on Nov. 14, 2006, the disclosure of which is incorporated herein in its entirety by reference.

TECHNICAL FIELD

The present invention relates to a light emitting diode display device and a portable terminal device.

BACKGROUND ART

In a portable telephone, there is used a light emitting diode (hereinafter referred to as LED) for decoration and notification. LEDs are also used for a display device of the portable telephone.

It is preferred that the display device using LEDs has high light emission quality. For example, there is proposed a structure for improving the light emission quality of backlight in a liquid crystal display device (see Patent Document 1).

Patent Document 1: Japanese Patent Laid Open Publication No. 2004-079488 (paragraph 0020, FIG. 10)

DISCLOSURE OF THE INVENTION

Problems to be Solved by the Invention

However, a conventional display device using LEDs has a problem that when two LEDs arranged adjacent to each other are made to emit light beams of different colors, the colors of the light beams emitted by the two LEDs are seen as mixed. For example, when one of the two LED arranged adjacent to each other emits a red light beam, and when the other LED emits a blue light beam, the two LEDs may be seen by the user as emitting a purple light beam.

Further, there is a problem that when two LEDs arranged adjacent to each other are made to emit light beams of the same color, the emitted light beams do not seem to be different from a light beam of only one LED. As a result, there is little merit in using a plurality of LEDs.

FIG. 1 is an exploded perspective view showing an example of a display device using LEDs in a portable telephone. As shown in FIG. 1, an LED display section in the portable telephone includes LEDs 1 and 2, a light guide member (hereinafter referred to as lens) 3 which is configured to guide light beams emitted by the LEDs so as to reflect the light beams to the outside, a printed board 4 in which the LEDs are installed, and a case 10A. Note that installing means arranging to provide.

First, the common lens 3 will be described. FIG. 2 is a sectional view showing a cross section in a case that the lens 3 is cut along the surface A-A shown in FIG. 1. The lens 3 includes light-emitting sections 31 to 33 and octagonal pyramid shaped cut-out sections 34 to 36.

The lens 3 is generally realized by a transparent material having an elongated shape. Further, each of the light-emitting sections 31 to 33 in the lens 3 is formed as a hemispherical projecting section, and is cut into a polyhedral shape. The lens 3 has a function to reflect the light beams emitted by the LEDs 1 and 2 by the cut-out sections 34 to 36 and the projecting sections 31 to 33. Therefore, it seems to the user viewing the case 10A as if the light beams were emitted by the light-emitting sections 31 to 33.

Each of the LED 1 and LED 2 is realized by a side emission type LED. As shown in FIG. 1, the LED 1 and the LED 2 are installed so as to respectively face both sides in the short side direction of the lens 3 on the printed board 4.

The LED 1 and LED 2 respectively emit light beams to the side surface portions in the short side direction of the lens 3. Then, it seems to the user viewing the case 10A as if the light beams are emitted by the three light-emitting sections 31 to 33 on the lens 3. That is, the light beams emitted by the LED 1 and the LED 2 are emitted from holes 11 to 13 of the case 10A, which holes are formed in correspondence with the three light-emitting sections 31 to 33 on the lens 3.

Next, there will be described the light emitting directions of the LEDs in the LED display section. FIG. 3 is an illustration for explaining traveling directions of light beams emitted by the LEDs in the LED display section of the portable telephone.

As shown in FIG. 3, in the LED arrangement shown in FIG. 1, the light beams emitted by the LED 1 and the LED 2, which are arranged adjacent to each other so as to respectively face both sides in the short side direction of the lens 3, interfere with each other. This results in a problem that the light beam emitted by the LED 1 and the light beam emitted by the LED 2 are observed, by the user viewing the case 10A, as being mixed with each other.

For example, when the LED 1 and the LED 2, which are arranged adjacent to each other, are respectively made to emit light beams of different colors, the colors of the light beams from the two LEDs are observed as being mixed with each other. More specifically, in FIG. 3, when the LED 1 emits a red light beam, and when the LED 2 emits a blue light beam, it seems to the user that the light-emitting sections 31 to 33 are emitting a purple light beam.

Further, in the case where the two LEDs arranged adjacent to each other are made to emit light beams of the same color, the light beams hardly seem to be different from a light beam at the time when only one of the LEDs is made to emit the light beam. Specifically, in both the cases where both the LED 1 and the LED 2 emit light beams, and where only the LED 1 emits a light beam, the light-emitting sections 31 to 33 of the lens 3 seem to emit a light beam in a similar manner. Thus, it seems to the user viewing the case 10A that there is no difference between the case where the LED 1 and LED 2 emit light beams and the case where only the LED 1 emits a light beam. Therefore, even when the two LEDs of the LED 1 and the LED 2 are provided, it is difficult to say that the LEDs are effectively used.

Thus, an exemplary object of a the present invention is to provide a light emitting diode display device and a portable terminal device, in which when a plurality of LEDs emits light beams, the light beams emitted by the respective LEDs are hardly mixed with each other and thereby the plurality of LEDs can be effectively used.

Means for Solving the Problems

A light emitting diode display device according to an exemplary aspect of the present invention includes a plurality of light emitting diodes, and light guide means for guiding a light beam emitted by each of the plurality of light emitting diodes, wherein the plurality of light emitting diodes are respectively arranged so that the light emitting surface of each of the light emitting diodes faces the light guide means so as to prevent the light beams emitted by the respective light emitting diodes from intersecting each other, and a plurality of emitting sections are provided on one surface of the light guide means.

In the light emitting diode display device according to the exemplary aspect of the present invention, a first light emitting diode and a second light emitting diode of the plurality of light emitting diodes are preferably arranged in such a manner that the traveling direction of the light beam emitted by the first light emitting diode to the light guide means is opposite to the traveling direction of the light beam emitted by the second light emitting diode to the light guide means, and that the central axes of the light beams emitted by the respective light emitting diodes are substantially in parallel with each other.

In the light emitting diode display device according to the exemplary aspect of the present invention, the first light emitting diode and the second light emitting diode of the plurality of light emitting diodes may also be arranged in such a manner that the traveling direction of the light beam emitted by the first light emitting diode to the light guide means is the same as the traveling direction of the light beam emitted by the second light emitting diode to the light guide means, and that the central axes of the light beams emitted by the respective light emitting diodes are substantially in parallel with each other.

In the light emitting diode display device according to the exemplary aspect of the present invention, the first light emitting diode and the second light emitting diode of the plurality of light emitting diodes may also be arranged in such a manner that the traveling direction of the light beam emitted by the first light emitting diode to the light guide means is opposite to the traveling direction of the light beam emitted by the second light emitting diode to the light guide means, that the central axes of the light beams emitted by the respective light emitting diodes are inclined with respect to the vertical axis of the light incident surface of the light guide means, and that the central axes of the light beams emitted by the respective light emitting diodes are prevented from intersecting each other.

Further, the light emitting diode display device according to the exemplary aspect of the present invention preferably includes control means for controlling the second light emitting diode to start light emission after a predetermined time elapses from the time when the first light emitting diode of the plurality of light emitting diodes is made to start light emission, and starting the control to stop the light emission of the second light emitting diode after a predetermined time elapses from the time when control to stop the light emission of the first light emitting diode is started.

Further, the control means of the light emitting diode display device according to the exemplary aspect of the present invention may control the first light emitting diode and the second light emitting diode in such a manner that when the light emission is started, the light intensity is changed to the maximum light intensity with the lapse of time, and that when the light emission is stopped, the light intensity is changed from the maximum light intensity to the light intensity at the light emission off time with the lapse of time.

Further, the control means of the light emitting diode display device according to the exemplary aspect of the present invention may control the first light emitting diode and the second light emitting diode in such a manner that when the light emission is started, the light intensity becomes the maximum light intensity, and that when the light emission is stopped, the light intensity becomes the light intensity at the light emission off time.

A portable terminal device according to the exemplary aspect of the present invention includes: a light emitting diode display device which includes a plurality of light emitting diodes, and light guide means for guiding a light beam emitted by each of the plurality of light emitting diodes, in which the plurality of light emitting diodes are respectively arranged so that the light emitting surface of each of the light emitting diodes faces the light guide means so as to prevent the light beams emitted by the respective light emitting diodes from intersecting each other, and in which a plurality of emitting sections are provided on one surface of the light guide means; and control means for controlling the second light emitting diode to start light emission after a predetermined time elapses from the time when the first light emitting diode of the plurality of light emitting diodes is made to start light emission, and starting the control to stop the light emission of the second light emitting diode after a predetermined time elapses from the time when control to stop the light emission of the first light emitting diode is started.

Further, the control means of the portable terminal device according to the exemplary aspect of the present invention may control the first light emitting diode and the second light emitting diode in such a manner that when the light emission is started, the light intensity is changed to the maximum light intensity with the lapse of time, and that when the light emission is stopped, the light intensity is changed from the maximum light intensity to the light intensity at the light emission off time with the lapse of time.

Further, the control means of the portable terminal device according to the exemplary aspect of the present invention may control the first light emitting diode and the second light emitting diode in such a manner that when the light emission is started, the light intensity becomes the maximum light intensity, and that when the light emission is stopped, the light intensity becomes the light intensity at the light emission off time.

Advantages of the Invention

According to the present invention, it is possible to provide a light emitting diode display device and a portable terminal device including the light emitting diode display device, in which when a plurality of LEDs arranged adjacent to each other are made to independently emit light beams, the light beams emitted by the respective LEDs are hardly mixed with each other.

BEST MODE FOR CARRYING OUT THE INVENTION

Exemplary Embodiment 1

In the following, exemplary embodiments according to the present invention will be described with reference to the accompanying drawings. FIG. 4 is a perspective view showing an example of a portable terminal device including a light emitting diode display device (hereinafter referred to as LED display device) according to the present invention. As shown in FIG. 4, in the exemplary embodiment, there will be described, as an example, a case where the portable terminal device is a folding-type portable telephone 100 (hereinafter simply referred to as portable telephone 100). Further, FIG. 4A corresponds to a perspective view seen from the side of an operation section in the state where the portable telephone 100 is opened. FIG. 4B corresponds to a rear view seen from the direction opposite to the side of the operation section in the state where the portable telephone 100 is opened. Note that the portable terminal device is not limited to the portable telephone, and may also be a portable terminal device such as, for example, a PDA and a PHS.

As shown in FIG. 4, the portable telephone 100 includes a display section side case 10 including a display section 20 and an operation section side case 30 including an operation section 40 having a plurality of key buttons. The display section side case 10 and the operation section side case 30 are realized by a rigid body formed by using, for example, synthetic resin, or the like. Further, the display section side case 10 and the operation section side case 30 are rotatably connected to each other by a hinge section 50 having an opening/closing shaft. Note that "rotation" means that circular movement can be performed in the forward and reverse directions around a shaft. In the portable telephone 100, for example, the display section side case 10 can be closed and opened toward and from the side of the operation section side case 30 by using the hinge section 50 as a shaft.

Further, the display section side case 10 includes an LED display section 60 in the surface facing the surface on the side in which the display section 20 is included. The portable telephone 100 has a function to notify the user of a voice incoming call, and the like, by the LED display section (light emitting diode display device) 60.

FIG. 5 is a block diagram showing a configuration example of the portable telephone 100. As shown in FIG. 5, the portable telephone 100 includes an antenna 110 which transmits and receives a radio wave, a control section 120, a storage section 130, a radio communication section 140, the operation section 40, the display section 20, a camera unit (hereinafter referred to as "camera") 150, LEDs 1 and 2, a loudspeaker 160 for voice output, and a microphone 170 for voice input. Note that FIG. 4 shows only a part of the camera unit 150. Further, the LEDs 1 and 2 are provided as a part of the LED display section 60 in the inside of the display section side case 10.

The control section 120 is realized by, for example, a CPU and a peripheral circuit (not shown). The control section 120 has a function to control respective sections included in the portable telephone 100. For example, the control section 120 controls the operation of the LEDs 1 and 2 according to a program stored in the storage section 130.

The storage section 130 is realized by a storage medium such as, for example, a RAM, and stores various data for a control program, and the like, executed by the control section 120. Note that a part of the storage section 130 may also be realized by a ROM, and the control program may also be stored in the ROM portion.

The radio communication section 140 has a function to perform modulation and demodulation of a signal. Specifically, the radio communication section 140 performs processing for receiving a radio signal via the antenna 110 and for modulating the received signal. Further, the radio communication section 140 performs processing for modulating a signal outputted from the control section 120 and for transmitting the modulated radio signal via the antenna 110.

The operation section 40 is realized by key buttons for performing, for example, input of a telephone number, and the like. The operation section 40 has a function to output to the control section 120 an input signal corresponding to an operation of the user.

The display section 20 is realized by, for example, a liquid crystal display device, and is installed in a position which is on the inside of the case at the time when the portable telephone 100 is folded. For example, a standby screen and a function setting screen are displayed in the display section 20.

The camera 150 has various functions included in, for example, a digital camera, and includes an image pickup device, such as a CCD, which captures a subject image, a circuit which outputs image data obtained by the image capturing to the control section 120, and the like.

The LEDs 1 and 2 are realized by a side emission type LED as will be described below. The LEDs 1 and 2 may be realized by a single color LED or may be realized a multicolor LED which emits light beams of a plurality of colors. The operation of the LEDs 1 and 2 is controlled by the control section 120.

Next, there will be described the structure of the LED display section 60. FIG. 6 is an exploded perspective view showing the LED display section 60. As shown in FIG. 6, the LED display section 60 includes the same components as those of the LED display section shown in FIG. 1. Note that in the LED display section 60 according to the exemplary embodiment, the arrangement positions of the LED 1 and the LED 2 are different from the arrangement positions of the LEDs in the LED display section shown in FIG. 1.

Further, in the exemplary embodiment, among the respective surfaces of the display section side case 10, in the state where a printed board 4 is attached to the display section side case 10, the surface on the side on which the light emission of LED can be visually recognized from the outside is referred to as the surface, and the surface on the side on which the light emission of LED cannot be visually recognized from the outside is referred to as the rear surface.

Note that the LED display section 60 includes the LED 1 and the LED 2 which are of the side emission type and which are arranged adjacent to each other at diagonal positions on the printed board 4, a lens (light guide means) 3 for guiding light beams emitted by the LED 1 and the LED 2 to three light-emitting sections, the printed board 4 including the LED 1 and the LED 2, and holes which are formed in the display section side case 10 in correspondence with the three light-emitting sections 31 to 33 on the lens 3.

The LED 1 and the LED 2 are arranged in such a manner that the light emitting surface of each of the LEDs is directed to the long side of the lens 3 having a shape of a substantially rectangular parallelepiped, and that the light beams emitted from the respective LEDs do not intersect each other. The LED 1 and the LED 2 respectively emit light beams to the side surface portions of the long side of the lens 3.

The lens 3 has a function of emitting, from the three light-emitting sections 31 to 33, the light beams which are emitted by the LED 1 and the LED 2 to the side surface portions of the lens 3. That is, the structure of the lens 3 is the same as the structure of the lens 3 shown in FIG. 2. The lens 3 has a function in which the light beams emitted by the LEDs 1 and 2 are reflected by cut-out sections 34 to 36 and the projecting sections (emitting sections) 31 to 33.

The light beams emitted by the LED 1 and the LED 2 are emitted from the holes of the display section side case 10, which holes are formed in correspondence with the three light-emitting sections 31 to 33 in the lens 3. The user can visually recognize the light beams of the LED 1 and the LED 2 from the surface side of the holes in the display section side case 10.

Next, there will be described the light emitting direction of the LEDs in the exemplary embodiment. FIG. 7 is an illustration for explaining the traveling directions of the light beams emitted by the LEDs in the exemplary embodiment.

As shown in FIG. 7, each of the LED 1 and the LED 2, which are arranged adjacent to each other at diagonal positions on the printed board 4, emits a light beam to the side surface portion of the long side of the lens 3.

Note that the LED 1 and the LED 2 are arranged in such a manner that the traveling directions of the light beams emitted by the respective LEDs are opposite to each other, and that the central axes of the light beams are substantially in parallel with each other. That is, the LED 1 and the LED 2 are respectively arranged to be shifted from each other on both sides of the lens 3 so that the optical axes of the LEDs do not coincide with each other. Thus, the light beams emitted light from the LED 1 and the LED 2 are emitted from the light-emitting sections 31 to 33 of the lens 3 without interfering with each other. The light beams emitted from the light-emitting sections are emitted through the holes of the display section side case 10, which holes are formed in correspondence with the three light-emitting sections 31 to 33 of the lens 3. Thereby, the emitted light beams are visually recognized by the user from the surface side.

That is, the light beams emitted by the LED 1 and the LED 2, which are arranged adjacent to each other at diagonal positions with respect to the lens 3, hardly interfere with each other. Therefore, the portable terminal device according to the exemplary embodiment is capable of avoiding the problem that when two LEDs arranged adjacent to each other are respectively made to emit light beams, the emitted light beams are mixed with each other.

Next, there will be described the light emission timing of the LED 1 and the LED 2. FIG. 8 is an illustration for explaining the light emission timing of the LED 1 and the LED 2 according to the exemplary embodiment. The light emission timing of the LED 1 and the LED 2 is specifically controlled by the control section 120.

As shown in FIG. 8, when starting light emission of the LED 1, the control section 120 first gradually increases the intensity of a light beam of A color (for example, red) emitted by the LED 1. Then, the control section 120 starts light emission of the LED 2 at a time point delayed by time td from the time point when the LED 1 is made to start the light emission (time point P in FIG. 8), and gradually increases the intensity of a light beam of A color emitted by the LED 2. Thereafter, when stopping the light emission of the LED 1, the control section 120 gradually reduces the intensity of the light beam of A color emitted by the LED 1, and starts control to stop the light emission of the LED 2 at a time point delayed by time td from the time point when the control to stop the light emission of the LED 1 is started (time point Q in FIG. 8). When stopping the light emission of the LED 2, the control section 120 gradually reduces the intensity of the light beam of A color emitted by the LED 2.

In other words, the control section 120 performs the control to start the light emission of the LED 2 after a predetermined time elapses from the time of starting the light emission of the LED 1, and starts the control to stop the light emission of the LED 2 after a predetermined time elapses from the time of starting the control to stop the light emission of the LED 1. Further, when starting the light emission of the LED 1 and the LED 2, the control section 120 controls the LED 1 and the LED 2 so that the light intensity of the LEDs is changed to the maximum light intensity with the lapse of time. When stopping the light emission of the LED 1 and the LED 2, the control section 120 controls the LED 1 and the LED 2 so that the light intensity of the LEDs are changed to the light intensity at the light emission off time with the lapse of time.

When such control is performed, the emitted light beams are visually recognized, by the user viewing from the surface side of the display section side case 10, as flowing on the surface of the lens 3 from the position corresponding to the installation position of the LED 1 to the position corresponding to the installation position of the LED 2. Note that the control section 120 changes the light intensity of the LEDs 1 and 2 by controlling the amount of current flowing through the LEDs 1 and 2. Further, the maximum light intensity is a light intensity set beforehand within a range of light intensity which can be realized by the LEDs 1 and 2.

As described above, the control section 120 may perform the control in such a manner that the light emission of the LED 1 and the delayed light emission of the LED 2 are set as one cycle, and that only light beams of color A are emitted for each cycle. However, the control section 120 may also perform the control so as to change the color of light beams emitted for each cycle, for example, in such a manner that light beams of color A are emitted for the first cycle, and that light beams of color B (for example, green) are emitted for the second cycle. When such control is performed, the emitted light beams are visually recognized, by the user viewing from the surface side of the display section side case 10, as flowing, while changing the emission color thereof, on the surface of the lens 3 from the position corresponding to the installation position of the LED 1 to the position corresponding to the installation position of the LED 2. Note that when such control is performed, LEDs having emission colors different from each other are used as the LEDs 1 and 2, or a multicolor LEDs are used as the LEDs 1 and 2.

As described above, the LED display section 60 on the display section side case 10 is configured so that the light beams emitted from the LED 1 and the LED 2 hardly interfere with each other. Therefore, in the LED display section 60, it is possible to avoid the problem that when the two LEDs arranged adjacent to each other are made to respectively emit light beams, the emitted light beams are mixed with each other. As a result, when the light emission timing of the LED 1 and the LED 2 is controlled by the control section 120, the light beams emitted from the LEDs are prevented from being mixed with each other. Thereby, the light beams emitted from the LED 1 and the LED 2 are visually recognized as flowing by the user viewing from the surface side of the display section side case 10.

Note that in the exemplary embodiment, the LED 1 and the LED 2 are arranged as shown in FIG. 6 and FIG. 7, but, for example, as shown in FIG. 9 and FIG. 10, the LED 1 and the LED 2 may also be arranged at diagonal positions different from the diagonal positions shown in FIG. 6 and FIG. 7. Even with such configuration, in the LED display section 60 on the display section side case 10, it is possible to avoid the problem that light beams emitted from two LEDs arranged adjacent to each other are mixed with each other.

Exemplary Embodiment 2

Next, there will be described a second exemplary embodiment with reference to the accompanying drawings. FIG. 11 is an exploded perspective view showing an LED display section 60 according to the exemplary embodiment. As shown in FIG. 11, an LED 1 and an LED 2 according to the exemplary embodiment are arranged opposite to each other on both sides of a lens 3. Further, the LED 1 and the LED 2 are arranged so that the traveling directions of the light beams emitted by the LED 1 and the LED 2 are opposite to each other. That is, the traveling direction of the light beam emitted to the lens 3 by the LED 1 is opposite to the traveling direction of the light emitted to the lens 3 by the LED 2, and the central axis of the light beam emitted by each of the LEDs is inclined with respect to the vertical axis of the light incident surface of the lens 3. Further, the central axes of the light beams emitted by the respective light emitting diodes are prevented from intersecting each other.

FIG. 12 is an illustration for explaining the traveling directions of the light beams emitted by the LEDs in the second exemplary embodiment. As shown in FIG. 12, the light beams emitted by the LED 1 and the LED 2 in the exemplary embodiment are reflected by light-emitting sections 31 to 33 of the lens 3 without interfering with each other.

For example, in the LED arrangement in FIG. 12, the light beam emitted by the LED 1 is mainly reflected by the light-emitting section 31, and the light beam emitted by the LED 2 is mainly reflected by the light-emitting section 33. Then, the light beams reflected by the light-emitting sections are emitted from holes of a display section side case 10, which holes are formed in correspondence with the three light-emitting sections on the lens 3, and are visually recognized by the user from the surface side of the display section side case 10.

As described above, in the exemplary embodiment, the LED 1 and the LED 2 are arranged adjacent to each other at diagonal positions in the long side direction of the lens 3, and further arranged so that the traveling directions of the light beams emitted by the LEDs are directed to the opposite directions. With such arrangement, the LED display section 60 can be configured so that the light beams emitted by the LED 1 and the LED 2 hardly interfere with each other.

Exemplary Embodiment 3

Next, there will be described a third exemplary embodiment with reference to the accompanying drawings. FIG. 13 is an exploded perspective view showing an LED display section according to the third exemplary embodiment. As shown in FIG. 13, an LED 1 and an LED 2 are arranged adjacent to each other in the same direction with respect to the side surface section of a long side of a lens 3. That is, the traveling direction of the light beam emitted to the lens 3 by the LED 1 is the same as the traveling direction of the light beam emitted to the lens 3 by the LED 2, and the central axes of the light beams emitted by the respective LEDs are substantially in parallel with each other.

FIG. 14 is an illustration for explaining the traveling directions of the light beams emitted by the LEDs in the third exemplary embodiment. As shown in FIG. 14, the traveling directions of the light beams emitted by the LED 1 and the LED 2 are the same. Further, the central axes of the light beams emitted by the LED 1 and the LED 2 are substantially in parallel with each other. Therefore, the light beams emitted by the LED 1 and the LED 2 hardly interfere with each other, and are reflected by light-emitting sections of the lens 3. Then, the light beams emitted from the light-emitting sections are emitted from holes of a display section side case 10, which holes are formed in correspondence with the three light-emitting sections on the lens 3, and are visually recognized by the user from the surface side of the display section side case 10.

As described above, even when the LED 1 and the LED 2 are arranged adjacent to each other in the same direction with respect to the side surface section of the long side of the lens 3, the light beams emitted from the LED 1 and the LED 2 hardly interfere with each other.

Exemplary Embodiment 4

Next, there will be described a fourth exemplary embodiment with reference to the accompanying drawings. The arrangement of an LED 1 and an LED 2 in the exemplary embodiment may be any of the arrangements according to the first to the third exemplary embodiments as described above. In the exemplary embodiment, a control method of the LED 1 and the LED 2 performed by the control section 120 is different from the control method in the first exemplary embodiment.

FIG. 15 is an illustration for explaining the control method of the LED 1 and the LED 2 performed by the control section 120. As shown in FIG. 15, the control section 120 controls the light emission timing of the LED 1 and the LED 2. In the exemplary embodiment, unlike the first exemplary embodiment shown in FIG. 8, the intensity of the light beams emitted by the LED 1 and the LED 2 is abruptly changed. That is, the control section 120 does not gradually increase or reduce the light intensity of the LED 1 and the LED 2, but abruptly increase or reduce the light intensity of the LED 1 and the LED 2.

The control section 120 first increases the intensity of the light beam of A color emitted by the LED 1. Then, the control section 120 increases the intensity of the light beam of A color emitted by the LED 2 at a time point delayed by time td from the time of starting light emission of the LED 1 (time point P in FIG. 15). In this case, the control section 120 abruptly increases the light intensity of the LED 1 and the LED 2. Thereafter, the control section 120 reduces the intensity of the light beam of A color emitted by the LED 1 at the time point of starting control to stop the light emission of the LED 1 (time point Q in FIG. 15). Then, the control section 120 reduces the intensity of the light beam of A color emitted by the LED 2 at a time point delayed by time td from the time point of starting the control of stopping the light emission of the LED 1 (time point Q in FIG. 15).

In other words, the control section 120 performs control to start the light emission of the LED 2 after the predetermined time elapses from the time of starting the light emission of the LED 1, and starts the control to stop the light emission of the LED 2 after the predetermined time elapses from the start of control to stop the light emission of the LED 1. Further, when starting the light emission of the LED 1 and the LED 2, the control section 120 controls the LED 1 and the LED 2 so that the light intensity of the LED 1 and the LED 2 becomes the maximum light intensity. When stopping the light emission of the LED 1 and the LED 2, the control section 120 controls the LED 1 and the LED 2 so that the light intensity of the LED 1 and the LED 2 becomes the light intensity at the light emission off time (light intensity is zero). Even when such control is performed, the light beams emitted from the LEDs are visually recognized by the user as flowing on the surface of lens 3 from the position corresponding to the installation position of the LED 1 to the position corresponding to the installation position of the LED 2.

The control section 120 may perform control in such a manner that the light emission of the LED 1 and the delayed light emission of the LED 2 are set as one cycle, and that light beams of the same color are emitted. However, as shown in FIG. 15, the control section 120 may also perform control so as to change the color of emitted light beams for each cycle, for example, in such a manner that light beams of A color are emitted in the first cycle, and that light beams of B color are emitted in the second cycle. When such control is performed, the emitted light beams are visually recognized, by the user viewing from the surface side of a display section side case 10, as flowing, while changing the emission color thereof, on the surface of the lens 3 from the position corresponding to the installation position of the LED 1 to the position corresponding to the installation position of the LED 2.

As described above, the control section 120 controls the light emission timing of the LED 1 and the LED 2, and thereby the light beams emitted from the LED 1 and the LED 2 can be visually recognized as flowing by the user viewing from the surface side of a display section side case 10.

Note that in the first to fourth exemplary embodiments, the number of the light-emitting sections on the lens 3 is limited to three, but the LED display section according to the present invention may include, for example, only one light-emitting section. Further, the LED display section according to the present invention may include, for example, five light-emitting sections. Even in such case, with the LED display section 60, it is possible to obtain the same effects as those in the first to fourth exemplary embodiments.

This application is the National Phase of PCT/JP2007/071031, filed Oct. 29, 2007, which is based upon and claims the benefit of priority from Japanese patent application No.

2006-307862, filed on Nov. 14, 2006, the disclosure of which is incorporated herein in its entirety by reference.

Industrial Applicability

The present invention is applied to a device effecting decoration and notification by using LEDs.

BRIEF DESCRIPTION OF THE DRAWINGS

FIG. 14 is an illustration for explaining traveling directions of light beams emitted by LEDs in the third exemplary embodiment; and FIG. 15 is an illustration for explaining a control method of the LED 1 and the LED 2 by a control section 120.

Figure 1:
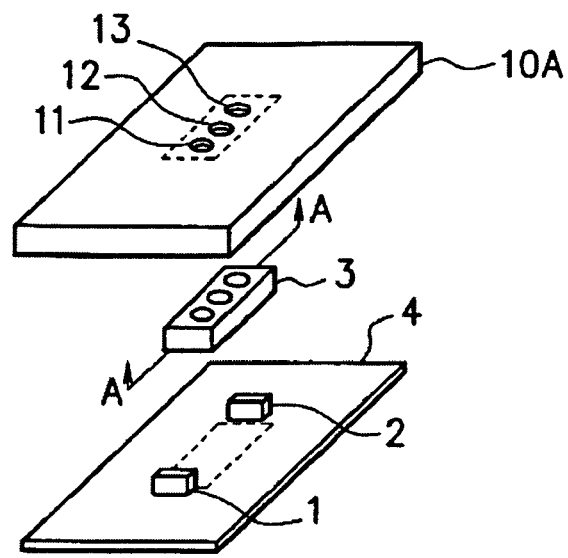
FIG. 1 is an exploded perspective view showing an example of a display device using LEDs in a portable telephone.
Figure 2:
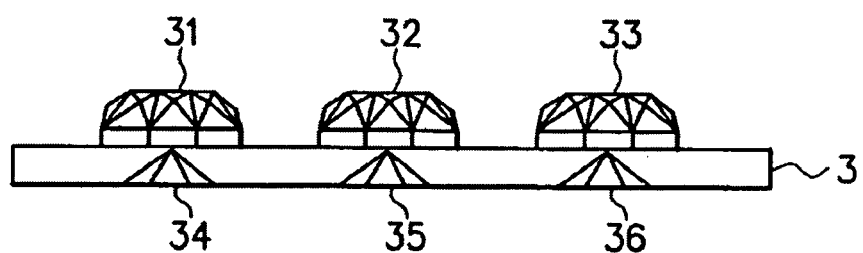
FIG. 2 is a sectional view showing a cross section of a lens 3 taken along the surface A-A shown in FIG. 1.
Figure 3:
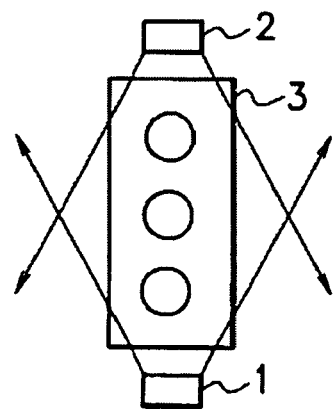
FIG. 3 is an illustration for explaining traveling directions of light beams emitted by LEDs in an LED display section of the portable telephone.
Figure 4A:
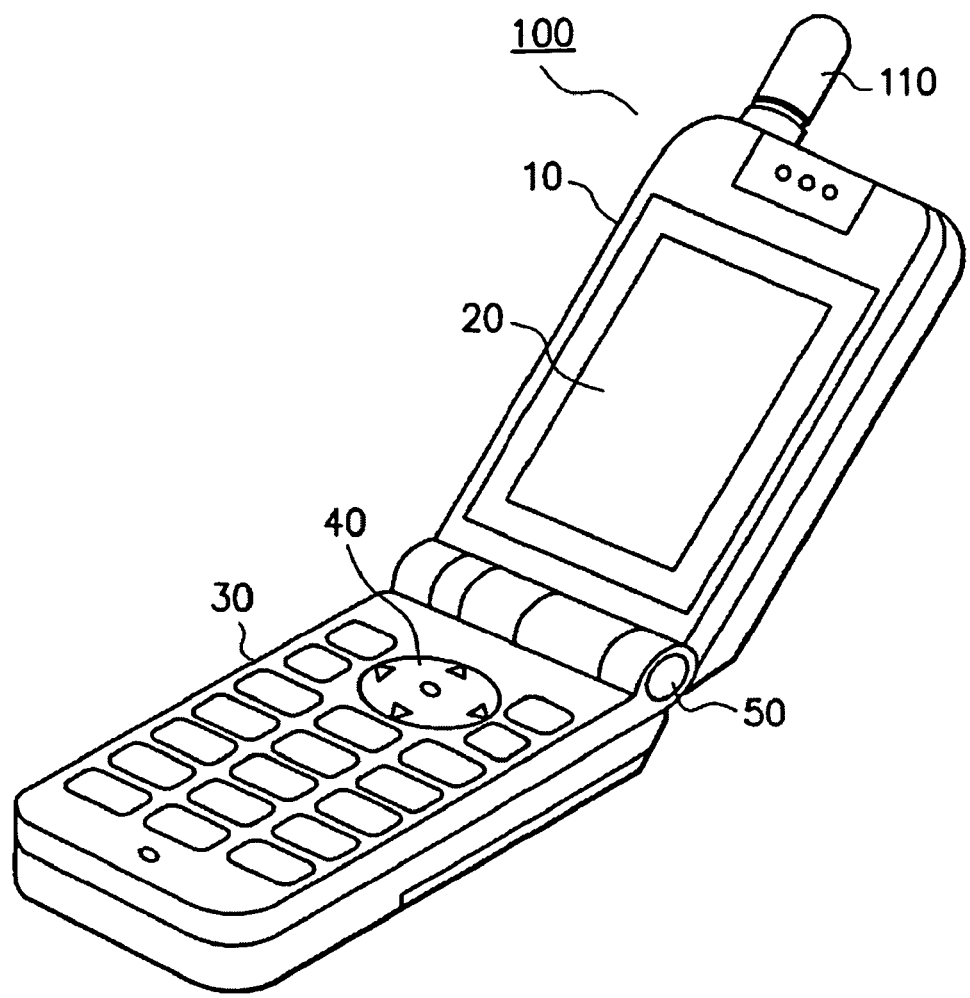
FIG. 4 is a perspective view showing an example of a portable terminal device provided with the LED display device.
Figure 4B:
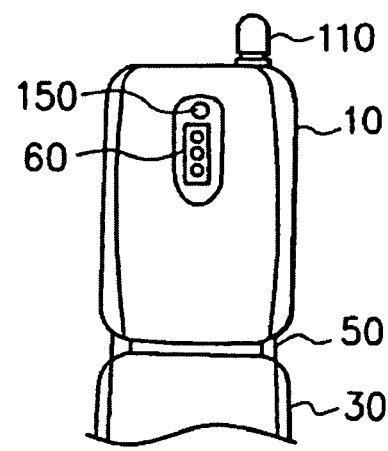
Figure 5:
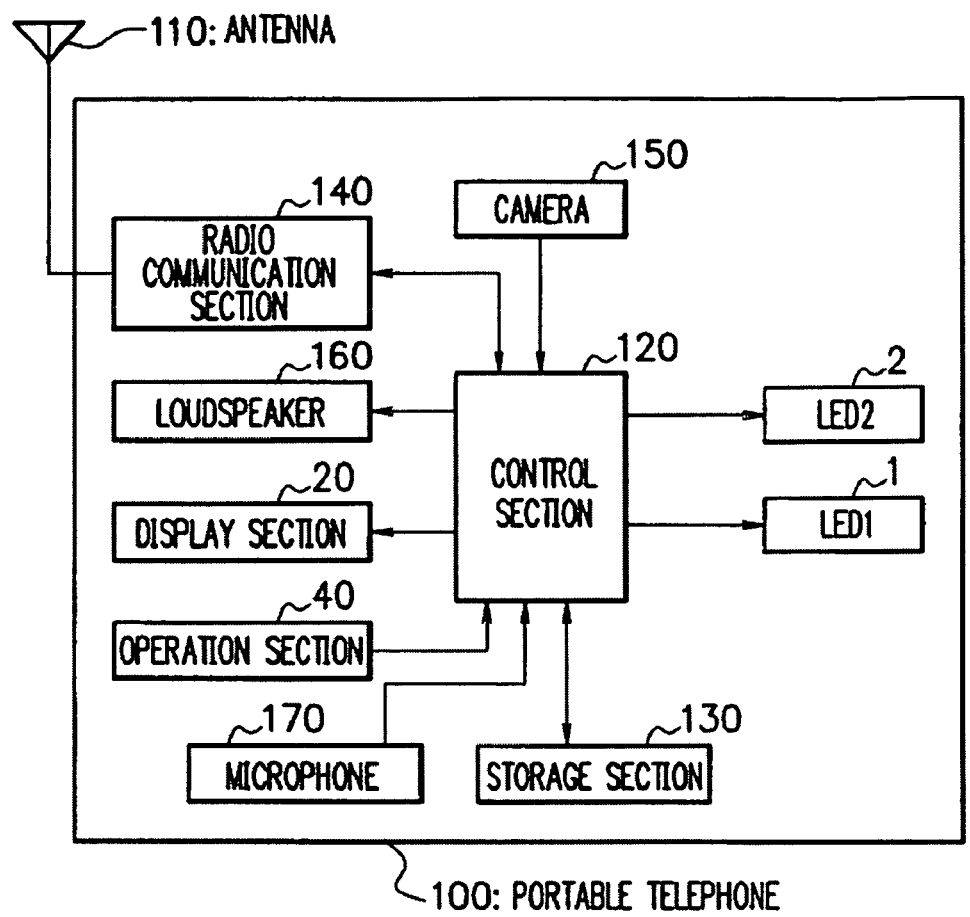
FIG. 5 is a block diagram showing a configuration example of the portable telephone.
Figure 6:
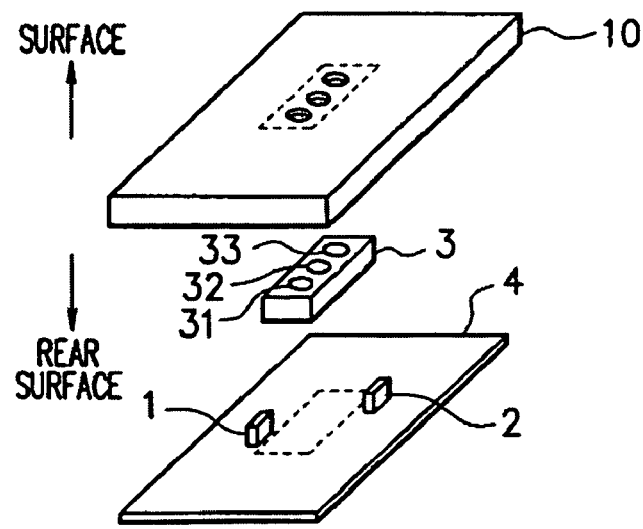
FIG. 6 is an exploded perspective view showing an LED display section.
Figure 7:
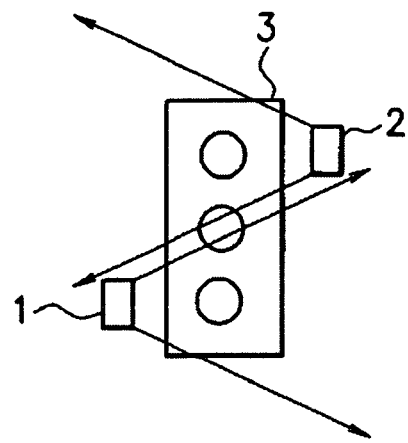
FIG. 7 is an illustration for explaining traveling directions of light beams emitted by LEDs in a first exemplary embodiment.
Figure 8:
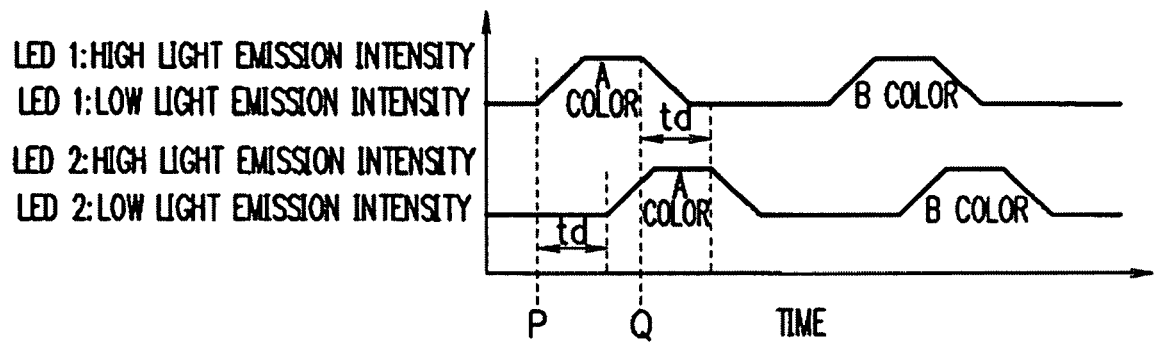
FIG. 8 is an illustration for explaining the light emission timing of an LED 1 and an LED 2 in the first exemplary embodiment.
Figure 9:
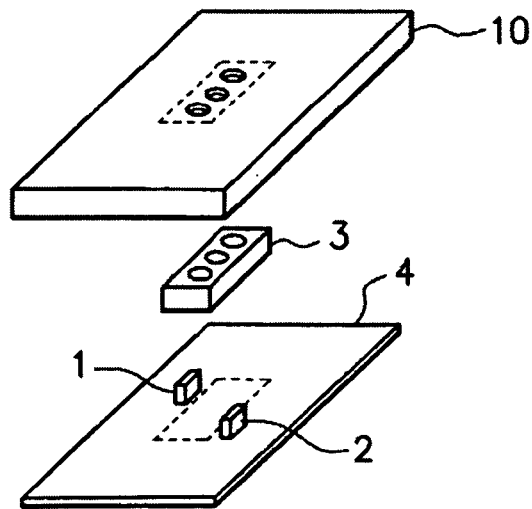
FIG. 9 is an exploded perspective view showing an LED display section of another mode of the first exemplary embodiment.
Figure 10:
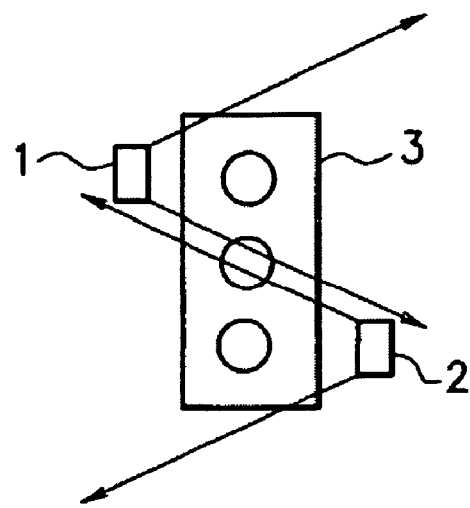
FIG. 10 is an illustration for explaining traveling directions of light beams emitted by LEDs in another mode of the first exemplary embodiment.
Figure 11:
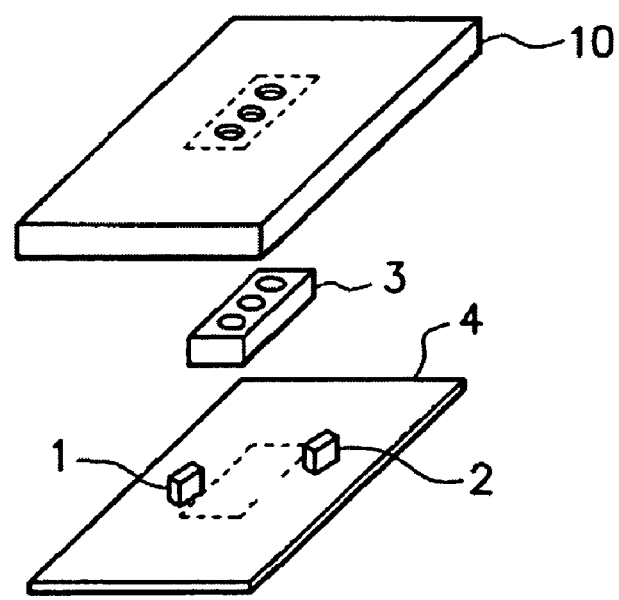
FIG. 11 is an exploded perspective view showing an LED display section in a second exemplary embodiment.
Figure 12:
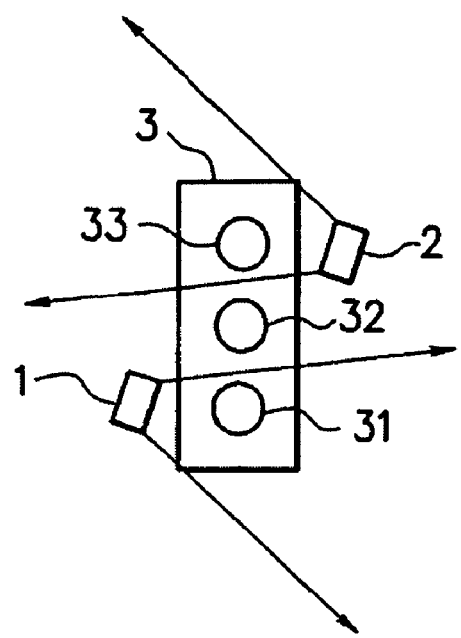
FIG. 12 is an illustration for explaining traveling directions of light beams emitted by LEDs in the second exemplary embodiment.
Figure 13:
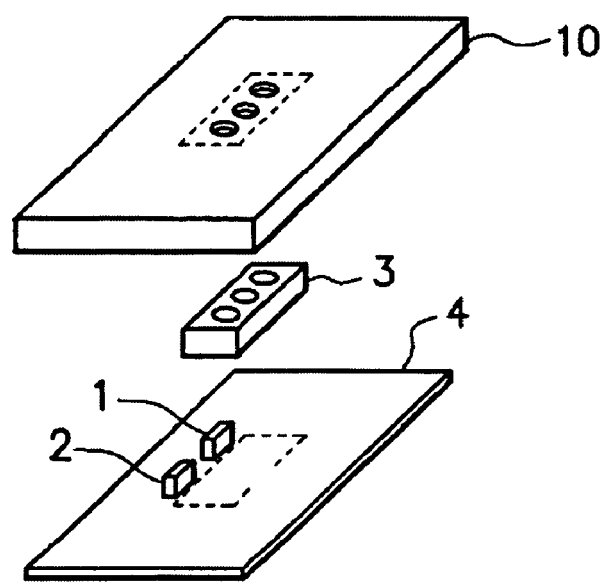
FIG. 13 is an exploded perspective view showing an LED display section according to a third exemplary embodiment.

| Description of Symbols | |
|---|---|
| 1, 2 | Light emitting diode (LED) |
| 3 | Lens |
| 4 | Printed board |
| 10 | Display section side case |
| 20 | Display section |
| 30 | Operation section side case |
| 31 to 33 | Light-emitting section |
| 34 to 36 | Cut-out section |
| 40 | Operation section |
| 50 | Hinge section |
| 60 | LED display section |
| 100 | Folding type portable telephone |
| 110 | Antenna |
| 120 | Control section |
| 130 | Storage section |
| 140 | Radio communication section |
| 150 | Camera unit |

| Description of Symbols | |
|---|---|
| 160 | Loudspeaker |
| 170 | Microphone |

The invention claimed is:

1. A light emitting diode display device comprising:
a plurality of light emitting diodes; and
a light guide unit for guiding a light beam emitted by each of the plurality of light emitting diodes,
wherein the plurality of light emitting diodes are respectively arranged in such a manner that the light emitting surface of each of the light emitting diodes faces the light guide unit, and that the light beams emitted by the respective light emitting diodes are prevented from intersecting each other, and wherein a plurality of emitting sections are provided on one surface of the light guide unit,
wherein a first light emitting diode and a second light emitting diode of the plurality of light emitting diodes are arranged in such a manner that the first light emitting diode and the second light emitting diode are respectively arranged at diagonal position with respect to the light guide unit when viewed from the direction of light beam emitted from the light guide unit, that the traveling direction of the light beam emitted by the first light emitting diode to the light guide unit is opposite to the traveling direction of the light beam emitted by the second light emitting diode to the light guide unit, that the central axes of the light beams emitted by the respective light emitting diodes are inclined with respect to the vertical axis of the light incident surface of the light guide unit, and that the central axes of the light beams emitted by the respective light, and
wherein the light guide unit has a first side and a second side opposite the first side, the first light emitting diode positioned at the first side of the light guide unit, and the second light emitting diode positioned at the second side of the light guide unit.

2. The light emitting diode display device according to claim 1, further comprising a control unit for controlling the second light emitting diode to start light emission after a predetermined time elapses from the time when the first light emitting diode of the plurality of light emitting diodes is made to start light emission, and starting the control to stop the light emission of the second light emitting diode after a predetermined time elapses from the time when control to stop the light emission of the first light emitting diode is started.

3. The light emitting diode display device according to claim 2, wherein the first light emitting diode and the second light emitting diode are controlled by the control unit in such a manner that when the light emission is started, the light intensity is changed to the maximum light intensity with the lapse of time, and that when the light emission is stopped, the light intensity is changed from the maximum light intensity to the light intensity at the light emission off time with the lapse of time.

4. The light emitting diode display device according to claim 2, wherein the first light emitting diode and the second light emitting diode are controlled by the control unit in such a manner that when the light emission is started, the light intensity becomes the maximum light intensity, and that when the light emission is stopped, the light intensity becomes the light intensity at the light emission off time.

5. A portable terminal device comprising:
a light emitting diode display device which includes a plurality of light emitting diodes, and a light guide unit for guiding a light beam emitted by each of the respective plurality of light emitting diodes, in which the plurality of light emitting diodes are respectively arranged in such a manner that the light emitting surface of each of the light emitting diodes faces the light guide unit, and that light beams emitted by the respective light emitting diodes are prevented from intersecting each other, and in which a plurality of emitting sections are provided on one surface of the light guide unit; and
a control unit for controlling a second light emitting diode to start light emission after a predetermined time elapses from the time when a first light emitting diode of the plurality of light emitting diodes is made to start light emission, and starting the control to stop the light emission of the second light emitting diode after a predetermined time elapses from the time when control to stop the light emission of the first light emitting diode is started,
wherein the first light emitting diode and the second light emitting diode of the plurality of light emitting diodes are arranged in such a manner that the first light emitting diode and the second light emitting diode are respectively arranged at diagonal position with respect to the light guide unit when viewed from the direction of light beam emitted from the light guide unit, that the traveling direction of the light beam emitted by the first light emitting diode to the light guide unit is opposite to the traveling direction of the light beam emitted by the second light emitting diode to the light guide unit, that the central axes of the light beams emitted by the respective light emitting diodes are inclined with respect to the vertical axis of the light incident surface of the light guide unit, and that the central axes of the light beams emitted by the respective light emitting diodes are prevented from intersecting each other, and
wherein the light guide unit has a first side and a second side opposite the first side, the first light emitting diode positioned at the first side of the light guide unit, and the second light emitting diode positioned at the second side of the light guide unit.

6. The portable terminal device according to claim 5, wherein the first light emitting diode and the second light emitting diode are controlled by the control unit in such a manner that when the light emission is started, the light intensity is changed to the maximum light intensity with the lapse of time, and that when the light emission is stopped, the light intensity is changed from the maximum light intensity to the light intensity at the light emission off time with the lapse of time.

7. The portable terminal device according to claim 5, wherein the first light emitting diode and the second light emitting diode are controlled by the control unit in such a manner that when the light emission is started, the light intensity becomes the maximum light intensity, and that when the light emission is stopped, the light intensity becomes the light intensity at the light emission off time.

8. A light emitting diode display device comprising:
a plurality of light emitting diodes; and
light guide means for guiding a light beam emitted by each of the plurality of light emitting diodes,
wherein the plurality of light emitting diodes are respectively arranged in such a manner that the light emitting surface of each of the light emitting diodes faces the light guide means, and that the light beams emitted by the respective light emitting diodes are prevented from intersecting each other, and wherein a plurality of emitting sections are provided on one surface of the light guide means,
wherein a first light emitting diode and a second light emitting diode of the plurality of light emitting diodes are arranged in such a manner that the first light emitting diode and the second light emitting diode are respectively arranged at diagonal position with respect to the light guide means when viewed from the direction of light beam emitted from the light guide means, that the traveling direction of the light beam emitted by the first light emitting diode to the light guide means is opposite to the traveling direction of the light beam emitted by the second light emitting diode to the light guide means, that the central axes of the light beams emitted by the respective light emitting diodes are inclined with respect to the vertical axis of the light incident surface of the light guide means, and that the central axes of the light beams emitted by the respective light emitting diodes are prevented from intersecting each other, and
wherein the light guide means has a first side and a second side opposite the first side, the first light emitting diode positioned at the first side of the light guide means, and the second light emitting diode positioned at the second side of the light guide means.

9. A portable terminal device comprising:
a light emitting diode display device which includes a plurality of light emitting diodes, and light guide means for guiding a light beam emitted by each of the respective plurality of light emitting diodes, in which the plurality of light emitting diodes are respectively arranged in such a manner that the light emitting surface of each of the light emitting diodes faces the light guide means, and that light beams emitted by the respective light emitting diodes are prevented from intersecting each other, and in which a plurality of emitting sections are provided on one surface of the light guide means; and
control means for controlling a second light emitting diode to start light emission after a predetermined time elapses from the time when a first light emitting diode of the plurality of light emitting diodes is made to start light emission, and starting the control to stop the light emission of the second light emitting diode after a predetermined time elapses from the time when control to stop the light emission of the first light emitting diode is started,
wherein the first light emitting diode and the second light emitting diode of the plurality of light emitting diodes are arranged in such a manner that the first light emitting diode and the second light emitting diode are respectively arranged at diagonal position with respect to the light guide means when viewed from the direction of light beam emitted from the light guide means, that the traveling direction or the light beam emitted by the first light emitting diode to the light guide means is opposite to the traveling direction of the light beam emitted by the second light emitting diode to the light guide means, that the central axes of the light beams emitted by the respective light emitting diodes are inclined with respect to the vertical axis of the light incident surface of the light guide means, and that the central axes of the light beams emitted by the respective light emitting diodes are prevented from intersecting each other, and
wherein the light guide means has a first side and a second side opposite the first side, the first light emitting diode positioned at the first side of the light guide means, and the second light emitting diode positioned at the second side of the light guide means.

* * * * *